United States Patent [19]

Jandu et al.

[11] Patent Number: 4,933,643
[45] Date of Patent: Jun. 12, 1990

[54] OPERATIONAL AMPLIFIER HAVING IMPROVED DIGITALLY ADJUSTED NULL OFFSET

[75] Inventors: Jaswinder S. Jandu, Mesa; Ira Miller, Tempe, both of Ariz.

[73] Assignee: Motorola Inc., Schaumburg, Ill.

[21] Appl. No.: 386,097

[22] Filed: Jul. 28, 1989

[51] Int. Cl.⁵ .......................... H03F 1/02; H03F 3/45
[52] U.S. Cl. ....................................... 330/9; 330/253; 330/257; 330/260; 330/261
[58] Field of Search .................. 330/9, 253, 257, 259, 330/260, 261

[56] References Cited

U.S. PATENT DOCUMENTS 4,806,875  2/1989  Schaffer .................................. 330/9
4,827,222  5/1989  Hester et al. ....................... 330/257

FOREIGN PATENT DOCUMENTS 2157108  10/1985  United Kingdom .................... 330/9

Primary Examiner—James B. Mullins
Attorney, Agent, or Firm—Michael D. Bingham

[57] ABSTRACT

An operational amplifier is provided having a null offset that may be digitally adjusted quickly and accurately. The operational amplifier includes a cascode current mirror in an output stage wherein a small portion of current in the cascode current mirror is diverted away into a digitally controlled current divider. The more current that is diverted away, the larger the differential voltage that is created between the inverting and noninverting inputs of the operational amplifier. The current is increased until the output of the operational amplifier switches from the positive supply voltage to the ground supply voltage or vise versa. Additionally, a compensation capacitor at the output of the operational amplifier is switched out of the circuit during adjustment to speed up the null offset adjustment. Because the current being adjusted is not directly at the inputs of the operational amplifier the common mode input range is not deteriorated.

11 Claims, 2 Drawing Sheets

OPERATIONAL AMPLIFIER HAVING IMPROVED DIGITALLY ADJUSTED NULL OFFSET

FIELD OF THE INVENTION

This invention relates in general to the field of operational amplifiers and, more particularly, to an operational amplifier having a digitally offset null that provides an increased common mode input range.

BACKGROUND OF THE INVENTION

Operational amplifiers are widely used in the electronics industry because of their many excellent circuit characteristics including high open loop gain, high input impedance, and low output impedance. General applications of the operational amplifier include circuit configurations such as voltage and current amplifiers, differentiators and integrators, active filters, oscillators, and analog to digital and digital to analog converters. To realize these different circuit configurations, operational amplifiers are used in conjunction with positive and or negative feedback in combination with passive and or active elements.

An operational amplifier is also widely used to function as a voltage comparator, wherein typically, a reference signal is applied to the inverting input and the voltage to be compared is applied to the noninverting input. If the magnitude of the voltage to be compared is greater than the magnitude of the reference signal, the output of the comparator is substantially equal to the positive supply voltage. If the magnitude of the voltage to be compared is less than the magnitude of the reference voltage, the output of the comparator is substantially equal to the negative or ground supply voltage. An inverted voltage comparator may be provided by simply transposing the signals at the inverting and noninverting inputs. Using the operational amplifier as a voltage comparator requires no external components or feedback, and its output only has two states of high and low.

The operational amplifier as utilized in the realization of a variety of circuit functions may be manufactured in bipolar or Complementary Metal Oxide Semiconductor (CMOS) technology or some combination thereof. The CMOS implementation is desirable for its low power consumption characteristic. Also, operational amplifiers are increasingly being integrated onto chips which merge digital and analog functions together with an increasing number of devices.

A typical problem associated with operational amplifiers is that of an offset error voltage. This type of error appears as deviations in the expected output due to imbalances in the input stage. This is further due to statistical deviations between the devices of the inverting and noninverting inputs. While this offset error is correctable by null offset adjustment, it requires additional circuitry and adds to the manufacturing time. A secondary problem often associated with null offset adjustment is a resulting decrease in the operational amplifiers input common mode range.

Early operational amplifiers provided additional pins to which a variable resistor could be connected for making a null offset adjustment. This had the disadvantages of requiring additional pins on the operational amplifier integrated circuit therein increasing its cost, requiring the additional resistor or trim potentiometer, and increasing the size of the printed circuit board. Also, the operational amplifier and trim potentiometer had different temperature coefficients and would not track over temperature changes causing the null offset to drift. An improved method of null offset adjustment is to trim a resistor on the integrated circuit itself by a laser beam while applying input signals and monitoring the output. This method improves the temperature coefficient problem but requires the additional circuitry, expensive laser beam equipment, reduction in input common mode range, adjustment time, and text fixtures. Due to the aging of the semiconductor, null offset adjustments may drift with no means available to readjust.

Thus, what is needed is an operational amplifier that does not require additional circuitry for null offset adjustment and having a null offset adjustment that may be done quickly and repeatedly if necessary.

SUMMARY OF THE INVENTION

Accordingly, it is an object of the present invention to provide an improved operational amplifier.

It is further an object of the present invention to provide an operational amplifier having a null adjustment method which provides an improved common input mode range.

It is yet a further object of the present invention to provide an operational amplifier whose null offset may be adjusted digitally.

In carrying out the above and other objects of the invention in one form, there is provided an operational amplifier having a digitally adjusted null offset, comprising a first current source for providing a first current to a differential input stage having inverting and noninverting inputs for amplifying the difference between first and second signals at the inverting and noninverting inputs, respectively. A second current source provides second and third currents wherein the second current may be digitally adjusted relative to a reference current of a current divider to affect the null offset between the inverting and noninverting inputs. The second current source is coupled to the current divider which receives a portion of the second current therein creating an imbalance between the second and third currents. The portion of the second current received by the current divider is a fraction of the reference current. A load stage is provided having a driver node, the load stage is coupled to the second current source and to the differential input stage for providing an amplifier signal at the driver node.

The above and other objects, features, and advantages of the present invention will be better understood from the following detailed description taken in conjunction with the accompanying drawings.

DETAILED DESCRIPTION OF THE INVENTION

Figure 1:
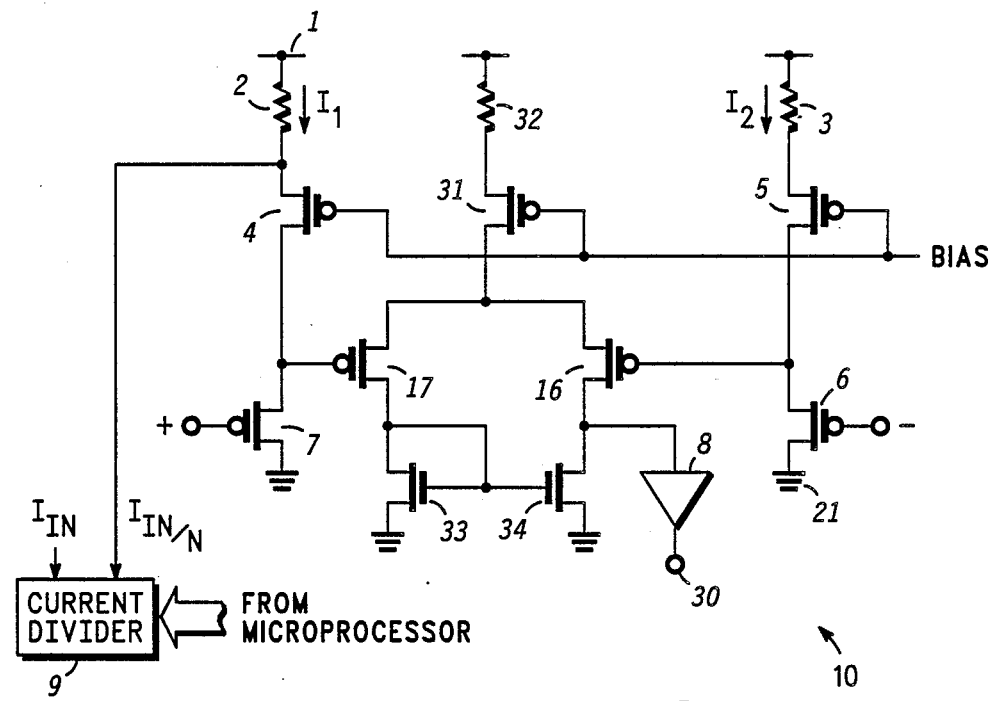
FIG. 1 is a schematic diagram of an operational amplifier having digital null offset adjustment.

An operational amplifier 10 having a null offset that may be adjusted digitally by a microprocessor, for example, is shown in FIG. 1. The null offset is adjusted by controlling a current $I_1$ relative to a current $I_2$. The operational amplifier 10 comprises a single ended amplifier 8 having an input connected to the drain of a P-type field effect transistor 16. The sources of a field effect transistor 17 and the field effect transistor 16 are connected to the drain of a P-type field effect transistor 31 whose source is coupled to a supply voltage terminal 1 by a resistor 32 and whose gate is connected to a current bias signal. The drains of field effect transistors 33 and 34 are connected to the drains of the field effect transistors 17 and 16, respectively. The sources of the field effect transistors 33 and 34 are connected to the supply voltage terminal 21 and their gates are connected to the drain of the field effect transistor 17. An inverting input signal is applied to the gate of a field effect transistor 6 and a noninverting input is applied to the gate of a field effect transistor 7. The sources of the field effect transistors 6 and 7 are connected to a supply voltage terminal 21 for receiving a ground supply voltage and the drains are connected to the gates of the field effect transistors 16 and 17, respectively.

The currents $I_1$ and $I_2$ are equal and are set by P-type field effect transistors 4 and 5 which have their gates connected to the current bias signal. The field effect transistor 5 has a source coupled to a supply voltage terminal 1 by a resistor 3 for receiving a positive supply voltage, and a drain connected to the gate of the field effect transistor 16. Similarly, the field effect transistor 4 has a source coupled to the supply voltage terminal 1 by a resistor 2, and a drain connected to the gate of the field effect transistor 17. It should be recongnized that the devices 2 through 7 are added for the purpose of null offset adjust and that the remaining devices comprise an uncompensated operational amplifier.

All of the devices 2 through 8, 16, 17, and 31 through 34 are integrated on a single substrate, and generally will have minor variations in electrical and physical characteristics due to nonuniformities or statistical variations in processing. As a result, when the inverting and noninverting input signals are equal, an output 30 of the operational amplifier 10 connected to the output of the single ended amplifier 8 is not at a voltage level midway between the positive and ground supply voltages as it would be in a perfectly balanced system. The potential at the output 30 will typically be substantially equal to either the positive supply voltage (positive polarity) or the ground supply voltage (negative polarity). To correct this imbalance, a portion of the current $I_1$, equal to $I_{IN}/N$, is drawn into a current divider 9 which is connected to the source of the field effect transistor 4 wherein $I_{IN}$ is a reference current and $I_{IN}/N$ is a fraction of $I_{IN}$ (N being a positive number). To ensure that $I_1$ is the current that must be modified, the operational amplifier may be designed so that the voltage at the noninverting input of the differential amplifier 8 will always be slightly lower than the voltage at the inverting input therein having a positive polarity offset. This may be done, for example, by making the size of the field effect transistor 5 smaller than the size of the field effect transistor 4.

The reference current, $I_{IN}$, is applied to the current divider 9. The amount of current drawn away from the operational amplifier 10 and received by the current divider 9 is a portion of $I_1$ equal to a fraction of $I_{IN}$. The fraction of $I_{IN}$ is equal to $I_{IN}$ divided by a variable N, and is equal to $I_{IN}/N$. A microprocessor or other dedicated digital monitoring logic (not shown) monitors the output voltage at the output 30 which will equal the ground supply voltage. The current $I_{IN}/N$ is incremented by a predetermined amount causing the voltage developed across the source and drain of the field effect transistor 4 to change therein causing the voltage at the noninverting input to change by a small amount, for example, 1 millivolt. Enough time is given to allow the output voltage to settle before the current $I_{IN}/N$ is again incremented. As soon as the output voltage switches from the ground supply voltage to the positive supply voltage the null offset is complete and is accurate to within at least 1 millivolt (or the amount of incremental change at the noninverting input).

The system described in FIG. 1 has the advantage of being able to dynamically adjust the null offset. This is important since over time, the characteristics of the operational amplifier 10 may change due to heat and aging affects. One drawback to the embodiment shown in FIG. 1 is the relatively long time it may take to perform the null offset adjustment since such small incremental changes are being made causing the output to switch slowly. This is, however, much faster than that of the adjustment required by an external trim potentiometer. Also, the common mode input range is limited due to the threshold voltages developed in series across the gate and source of the field effect transistors 6 and 16, for example (this also occurs across the field effect transistors 7 and 17). This causes the voltage at the drain of the field effect transistor 31 to equal the inverting input voltage plus the sum of the threshold voltages of the field effect transistors 6 and 16. As a result, when the inverting input voltage is approximately equal to the positive supply voltage less the sum of two threshold voltages (of the field effect transistors 6 and 16), a current $I_3$ flowing through the field effect transistor 31 is reduced causing the operational amplifier 10 to operate less accurately. This can be seen more clearly by the following relationship of the common mode voltage ($V_{CM}$) at the gate of the field effect transistor 6 as follows:

$$V_{CM} = V_{DD} - V_{32} - V_{DS31} - V_{GS16}V_{GS6};$$

wherein $V_{DD}$ is the positive supply voltage, $V_{32}$ is the voltage developed across the resistor 32, $V_{DS31}$ is the drain to source voltage across the field effect transistor 31, and $V_{GS16}$ and $V_{GS6}$ are the gate to source voltages developed across the field effect transistors 16 and 6, respectively.

The noninverting input is limited by the same conditions due to the field effect transistors 7 and 17. Thus the common mode input range is limited to approximately two P-type field effect transistor threshold voltages below the positive supply voltage (due to the threshold voltages required).

Figure 2:
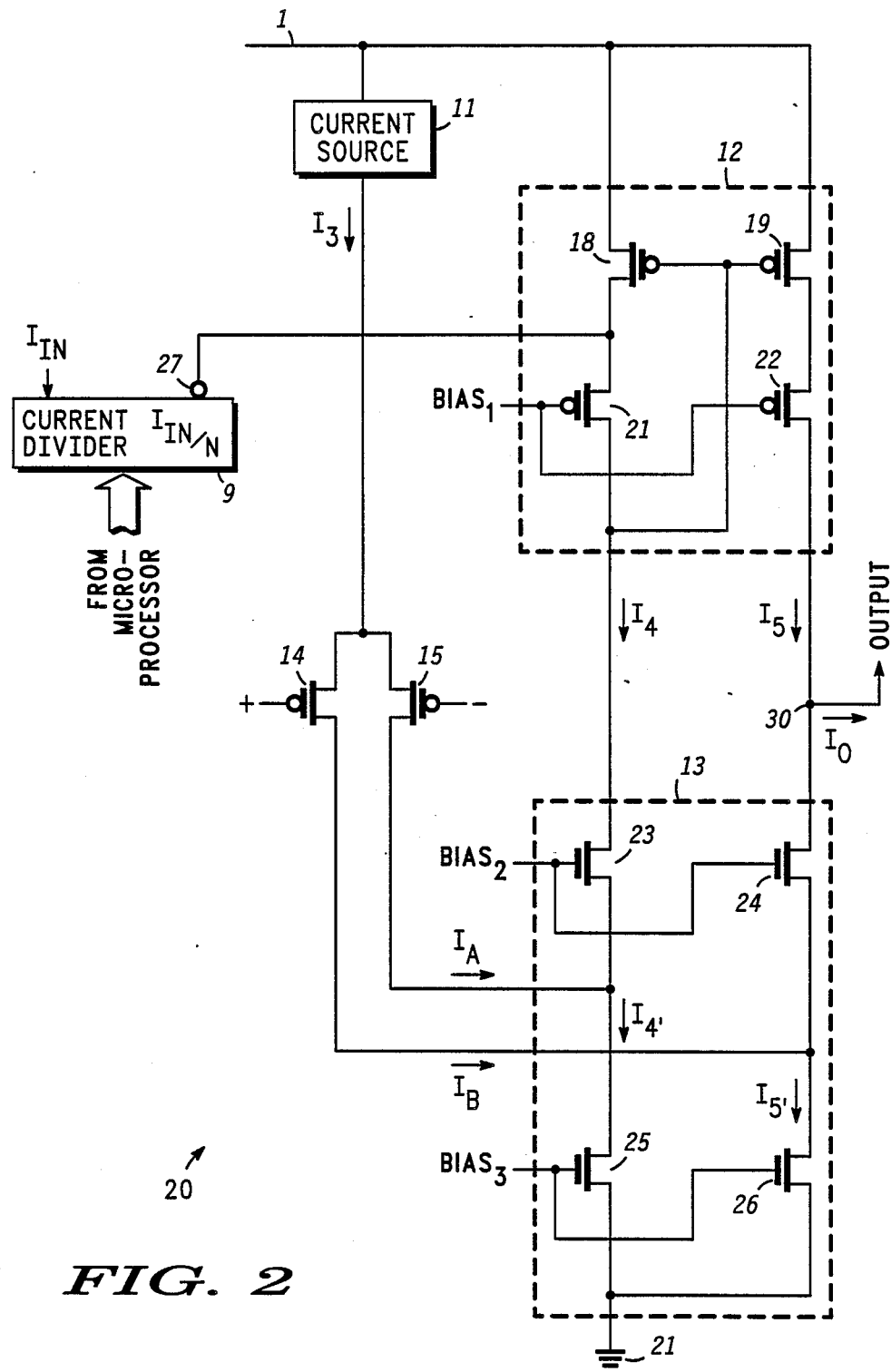
FIG. 2 is a schematic diagram of the preferred embodiment of the present invention.

An improved monolithically integrated operational amplifier 20 having a digitally adjusted null offset is shown in FIG. 2. Structures in FIG. 1 that are identical to structures in FIG. 2 are identified by the same numbers. A current source 11 is connected to the supply voltage terminal 1 for receiving the positive supply voltage and supplies a constant current $I_3$ to field effect transistors 14, and 15. The field effect transistors 14 and 15 each have a source connected to the current source 11 and a gate connected for receiving the noninverting and inverting input signals, respectively. An output stage is comprised of a cascode current mirror 12 and a load stage 13.

The cascode current mirror 12 includes a field effect transistor 18 having a source connected to the supply voltage terminal 1 and a drain connected to the offset adjust terminal 27 which connects to the current divider 9. A field effect transistor 19 has a source connected to the supply voltage terminal 1 and a gate connected to the gate of the field effect transistor 18. Field effect transistors 21 and 22 have their gates connected to a $bias_1$ voltage and their sources connected to the drains of the field effect transistors 18 and 19, respectively. The load stage 13 comprises a field effect transistor 23 having a drain connected to the drain of the field effect transistor 21 and to the gate of the field effect transistor 18, a gate connected to a $bias_2$ voltage, and a source connected to the drain of the field effect transistor 15. A field effect transistor 24 has a drain connected to the drain of the field effect transistor 22, a gate connected to the $bias_2$ voltage and a source connected to the drain of the field effect transistor 14. Field effect transistors 25 and 26 have their drains connected to the sources of the field effect transistors 23 and 24, respectively, their gates connected to a $bias_3$ voltage and their sources connected to the supply voltage terminal 21. The output 30 is connected to the drain of the field effect transistor 22.

If the devices making up the operational amplifier 20 were all perfectly matched, the currents $I_4$ and $I_5$ would be equal and an output current $I_0$ would equal zero when the noninverting and inverting input voltages are equal at the gates of the field effect transistors 14 and 15, respectively. In this ideal case, no offset voltage would exist between inverting and noninverting input voltages. Because the devices making up the operational amplifier 20 are not prefectly matched, the current $I_0$ is not equal to zero since the current $I_4$ is not equal to the current $I_5$. The output current $I_0$ could be adjusted to equal zero by making the currents $I_4$ and $I_B$ unequal so that $I_{4'}$ would equal $I_{5'}$ (wherein $I_{4'}$ is equal to $I_4+I_A$ and $I_{5'}$ is equal to $I_5+I_B$). The difference between the inverting and noninverting voltages to accomplish this would then be the offset voltage.

Because it is desireable to have an offset voltage of zero volts, this method is not used. The adjustment of the null offset in the operational amplifier 20 is made by controlling the current $I_4$ with respect to the current $I_5$ in the cascode current mirror 12 by reducing the current $I_4$ to equal the current $I_5$. The operational amplifier 20 is designed to ensure the current $I_4$ is greater than the current $I_5$, and the output current $I_0$ is equal to $I_5-I_{5'}$. The current $I_{IN}/N$ going into the current divider 9 is ramped up which reduces the current $I_4$ by the amount equal to $I_{IN}/N$. The current $I_4$ is reduced until the current $I_0$ is equal to zero while the noninverting and inverting input voltages are equal (i.e., zero offset voltage). It should be appreciated that the devices 2 through 8 of FIG. 1 could be added to the operational amplifier 20 in like manner for the purpose of null offset adjustment.

Figure 3:
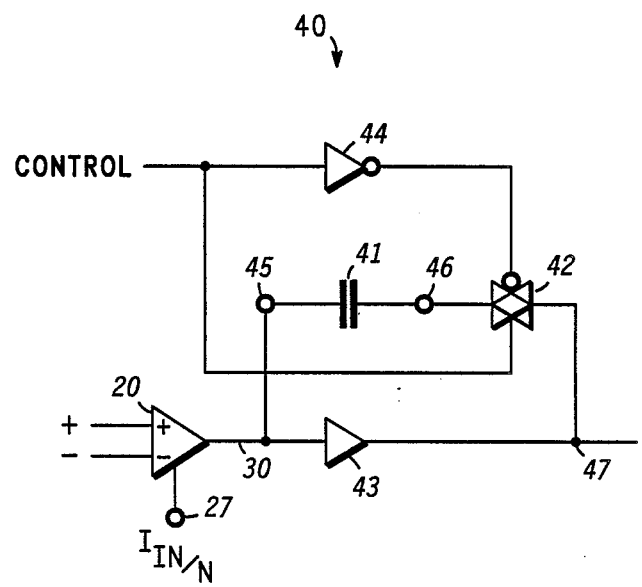
FIG. 3 is a block diagram of preferred embodiment of the present invention.

FIG. 3 is a block diagram of the preferred embodiment of the present invention comprising the operational amplifier 20 with an additional driver stage 43, compensation capacitor 41, transmission gate 42, and inverter 44. These components would typically be integrated into a single operational amplifier 40. The operational amplifier 20 has an offset adjust terminal 27 for controlling the null offset adjustment and has its output 30 connected as a driver node to the input of the driver stage 43 and to a terminal 45 of the capacitor 41. The transmission gate 42 has a first current carrying electrode connected to a terminal 46 of the capacitor 41 and a second current carrying electrode connected to the output 47 of the driver stage 43. The inverting control input of the transmission gate 42 is connected to the output of the inverter 44, and the noninverting control input is connected to the input of the inverter 44. A control signal applied to the input of the inverter 44 causes the transmission gate 42 to turn on and off.

The null offset adjustment is made as before except that the compensation capacitor 41 is switched out of the circuit 40 by turning the transmission gate 42 off by the control signal. The compensation capacitor 41 is typically used to improve the stability of the operational amplifier 40 and is not necessary to perform null offset adjustment. The speed of the output signal is made much slower with the compensation capacitor 41 switched in since the current $I_{IN}/N$ is changed in such small increments. With the capacitor switched out, the operational amplifier 40 is uncompensated and operates as a comparator. The resistance of the transmission gate 42 when it is switched on may be used to further improve the stability of the operational amplifier 40. The null offset adjustment may now be digitally set very quickly without degrading the common mode input voltage.

By now it should be appreciated that there has been provided an operational amplifier having a digitally offset null that may be quickly adjusted and does not decrease the common mode input range.

We claim:

1. A monolithically integrated operational amplifier having inverting and noninverting inputs that are unbalanced in a predetermined polarity, said operational amplifier having an electronically adjustable null offset wherein the null offset adjustment is made while said operational amplifier is uncompensated, comprising:
   first amplifier means having an output and differential inputs for amplifying the difference between inverting and noninverting signals at the inverting and noninverting inputs, respectively, wherein said first amplifier means includes a cascode current mirror having a null offset adjust node;
   second amplifier means having an input coupled to the output of said first amplifier means, and an output coupled for providing an output signal;
   a capacitor having a first terminal coupled to the input of said second amplifier means and having a second terminal;
   a first transmission gate having a first current carrying node coupled to the second terminal of said capacitor, a second current carrying node coupled to the output of said second amplifier means, and a controlling node coupled for receiving a null adjust signal.

2. An operational amplifier having a digitally adjustable null offset, comprising:
   first current source means for providing a first current having a predetermined magnitude;
   differential amplifier means coupled for receiving said first current and being response to a differential input signal for providing a differential output signal;
   second current source means including a current mirror for providing second and third currents flowing through first and second outputs;
   a load stage having first and second conduction paths respectively coupled to said first and second outputs of said second current source means for conducting said second and third currents therethrough, said first and second conduction paths being coupled for receiving said differential output signal for providing an amplifier signal at a driver node provided at said second output of said second current source means; and current divider circuit responsive to a reference current and a control input signal and having an input coupled to said first output of said second current source means for sinking a portion of said second current substantially equal to the ratio of said reference current and said control input signal wherein said control input signal is selected to adjust the magnitude of said second current to equal that of said third current.

3. The operational amplifier according to claim 2, wherein said operational amplifier is monolithically integrated in a MOS technology.

4. The operational amplifier according to claim 3 wherein said current mirror comprises:

a first field effect transistor having a source coupled for receiving a first supply voltage, a drain coupled to said current divider means, and having a gate;

a second field effect transistor having a source coupled to said current divider means, a gate coupled for receiving a first bias voltage, and a drain coupled to the gate of said first field effect transistor;

a third field effect transistor having a source coupled for receiving the first supply voltage, a gate coupled to the gate of said first field effect transistor, and having a drain; and a fourth field effect transistor having a source coupled to the drain of said third field effect transistor, a gate coupled to the gate of said second field effect transistor, and a drain coupled to the driver node.

5. The operational amplifier according to claim 4 wherein said load stage further comprises:

a fifth field effect transistor having a drain coupled to the drain of said second field effect transistor, a gate coupled for receiving a second bias voltage, and a source coupled to said differential amplifier means;

a sixth field effect transistor having a drain coupled to the source of said fifth field effect transistor, a gate coupled for receiving a third bias voltage, and a source coupled for receiving a second supply voltage;

a seventh field effect transistor having a drain coupled to the driver node, a gate coupled to the gate of said fifth field effect transistor, and a source coupled to said differential amplifier means; and an eighth field effect transistor having a drain coupled to the source of said seventh field effect transistor, a gate coupled to the gate of said sixth field effect transistor, and a source coupled for receiving the second supply voltage.

6. The operational amplifier according to claim 5 further comprising:

driver means having an input coupled to the driver node and having an output terminal for providing an amplified output signal;

a compensation capacitor having a first terminal coupled to the input of said driver means and having a second terminal; and switching means coupled between the second terminal of said compensation capacitor and said output terminal for selectively switching out said compensation capacitor wherein said operational amplifier operates as a comparator during null offset adjustment for the purpose of decreasing the response time of the output signal.

7. The operational amplifier according to claim 6 wherein said switching means comprises a transmission gate.

8. An operational amplifier having an offset in a predetermined direction between inverting and noninverting inputs, said operational amplifier having a digitally adjustable null offset, wherein the null offset adjustment is made with said operational amplifier operating in a comparator mode, comprising:

a first supply voltage terminal for supplying a first supply voltage;

a second supply voltage terminal for supplying a second supply voltage;

first current source means coupled to said first supply voltage terminal for providing a first current having a predetermined magnitude;

differential amplifier means coupled for receiving said first current and being response to a differential input signal for providing a differential output signal;

second current source means including a current mirror for providing second and third currents flowing through first and second outputs;

a load stage having first and second conduction paths respectively coupled to said first and second outputs of said second current source means for conducting said second and third currents therethrough, said first and second conduction paths being coupled for receiving said differential output signal for providing an amplifier signal at a driver node provided at said second output of said second current source means;

current divider circuit responsive to a reference current and a control input signal and having an input coupled to said first output of said second current source means for sinking a portion of said second current substantially equal to the ratio of said reference current and said control input signal wherein said control input signal is selected to adjust the magnitude of said second current to equal that of said third current; and driver means having an input coupled to the driver node and having an output terminal for amplifying the amplifier signal.

9. The operational amplifier according to claim 8 wherein said current mirror comprises:

a first field effect transistor having a source coupled to said first supply voltage terminal, a drain coupled to said current divider means, and having a gate;

a second field effect transistor having a source coupled to said current divider means, a gate coupled for receiving a first bias voltage, and a drain coupled to the gate of said first field effect transistor;

a third field effect transistor having a source coupled to said first supply voltage terminal, a gate coupled to the gate of said field effect transistor, and having a drain; and a fourth field effect transistor having a source coupled to the drain of said third field effect transistor, a gate coupled to the gate of said second field effect transistor, and a drain coupled to the driver node.

10. The operational amplifier according to claim 9 wherein said load stage further comprises:

a fifth field effect transistor having a drain coupled to the drain of said second field effect transistor, a gate coupled for receiving a second bias voltge, and a source coupled to said differential input means;

a sixth field effect transistor having a drain coupled to the source of said fifth field effect transistor, a gate coupled for receiving a third bias voltage, and a source coupled to said second supply voltage terminal;

a seventh field effect transistor having a drain coupled to the driver node, a gate coupled to the gate of said fifth field effect transistor, and a source coupled to the differential input means; and an eighth field effect transistor having a drain coupled to the source of said seventh field effect transistor, a gate coupled to the gate of said sixth field effect transistor, and a source coupled to said second supply voltage terminal.

11. The operational amplifier according to claim 10 wherein said driver means comprises:

an amplifier having an input coupled to the input of the driver means and having an output coupled to the output of said driver means;

a compensation capacitor having a first terminal coupled to the input of said amplifier and having a second terminal; and switching means coupled between the second terminal of said compensation capacitor and output of said amplifier for selectively switching out said compensation capacitor wherein said operational amplifier operates as a comparator during null offset adjustment for the purpose of decreasing the response time of the output signal.

* * * * *